(12) United States Patent
Seah et al.

(10) Patent No.: US 6,689,653 B1
(45) Date of Patent: Feb. 10, 2004

(54) METHOD OF PRESERVING THE TOP OXIDE OF AN ONO DIELECTRIC LAYER VIA USE OF A CAPPING MATERIAL

(75) Inventors: Xavier Teo Leng Seah, Singapore (SG); Chivukula Subrahmanyam, Singapore (SG); Rajan Rajgopal, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/464,255

(22) Filed: Jun. 18, 2003

(51) Int. Cl.$^7$ ............................................ H01L 21/8247
(52) U.S. Cl. ...................... 438/201; 438/258; 438/261
(58) Field of Search ............................... 438/201, 211, 438/258, 261, 264, 275

(56) References Cited

U.S. PATENT DOCUMENTS

| | | | |
|---|---|---|---|
| 6,133,096 A | * 10/2000 | Su et al. | 438/264 |
| 6,207,501 B1 | * 3/2001 | Hsieh et al. | 438/258 |
| 6,420,223 B2 | * 7/2002 | Camerlenghi | 438/211 |
| 6,448,126 B1 | * 9/2002 | Lai et al. | 438/264 |
| 6,455,374 B1 | * 9/2002 | Lee et al. | 438/260 |
| 2003/0036234 A1 | * 2/2003 | Doi | 438/258 |

* cited by examiner

Primary Examiner—Chandra Chaudhari
(74) Attorney, Agent, or Firm—George O. Saile; Rosemary L. S. Pike

(57) ABSTRACT

Methods of protecting, and increasing the thickness of, the oxidized silicon nitride (ON), component of an oxidized silicon nitride on silicon oxide (ONO), layer of a non-volatile memory device, during the hydrofluoric (HF), acid type procedures used for peripheral devices simultaneously fabricated with the non-volatile memory device, has been developed. A first method features a silicon nitride layer located only overlying the ONO layer of the non-volatile memory device, formed prior to HF type pre-clean procedures performed prior to gate oxidation procedures used for peripheral devices. After the gate oxidation procedures the silicon nitride capping layer is selectively removed. A second method features a polysilicon capping layer again located only overlying the ONO layer of the non-volatile memory device, again formed prior to HF type pre-clean procedures. For this iteration the protective polysilicon capping layer is oxidized during subsequent gate oxidation procedures and adds onto the ONO layer, subsequently overlaid by a control gate structure of the non-volatile memory device.

31 Claims, 8 Drawing Sheets

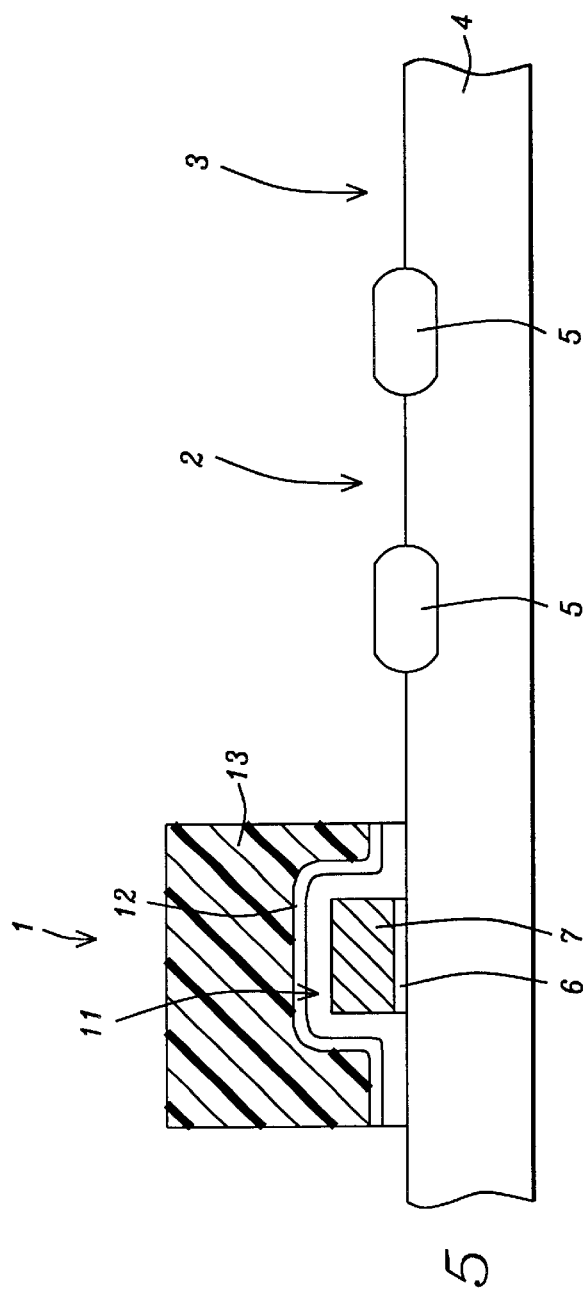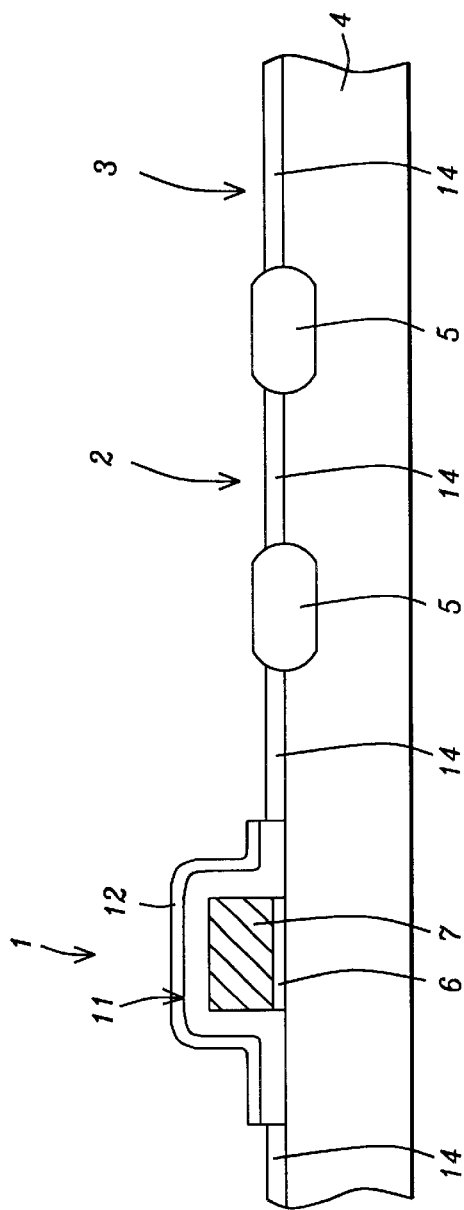
FIG. 5
FIG. 6

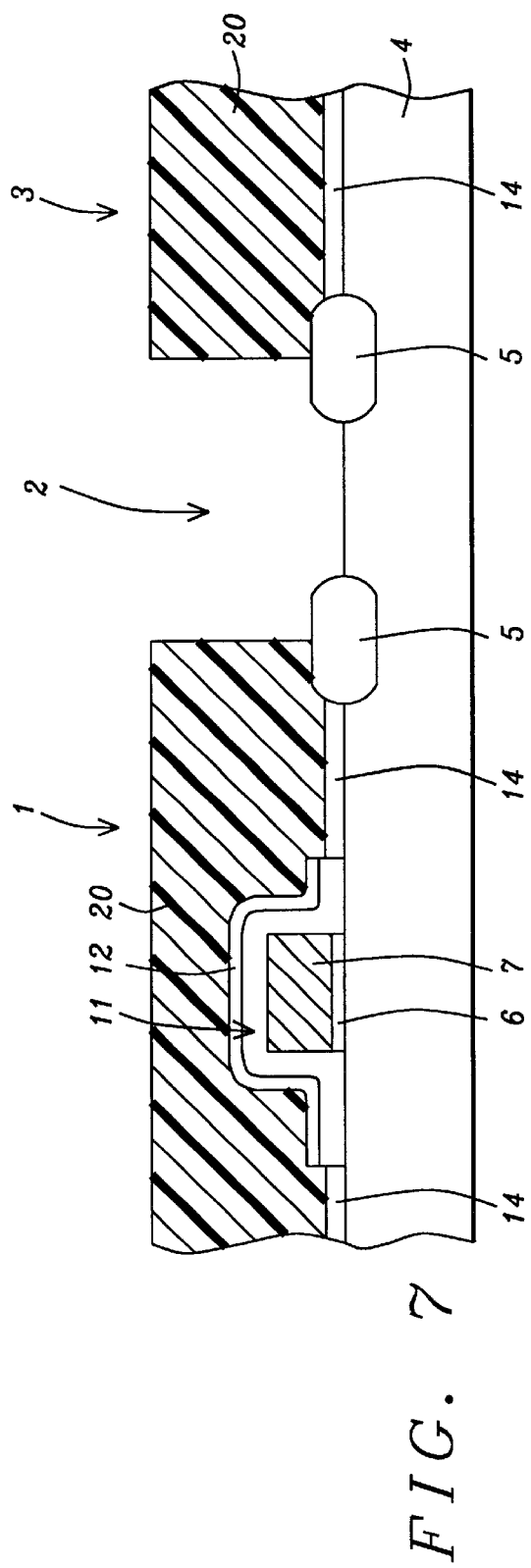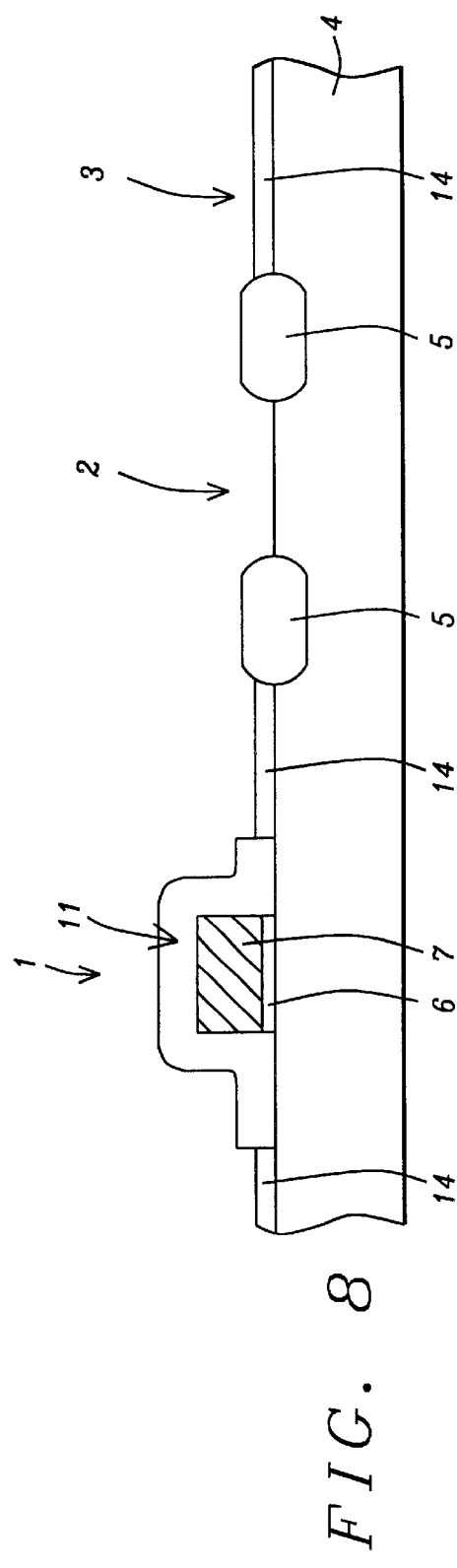

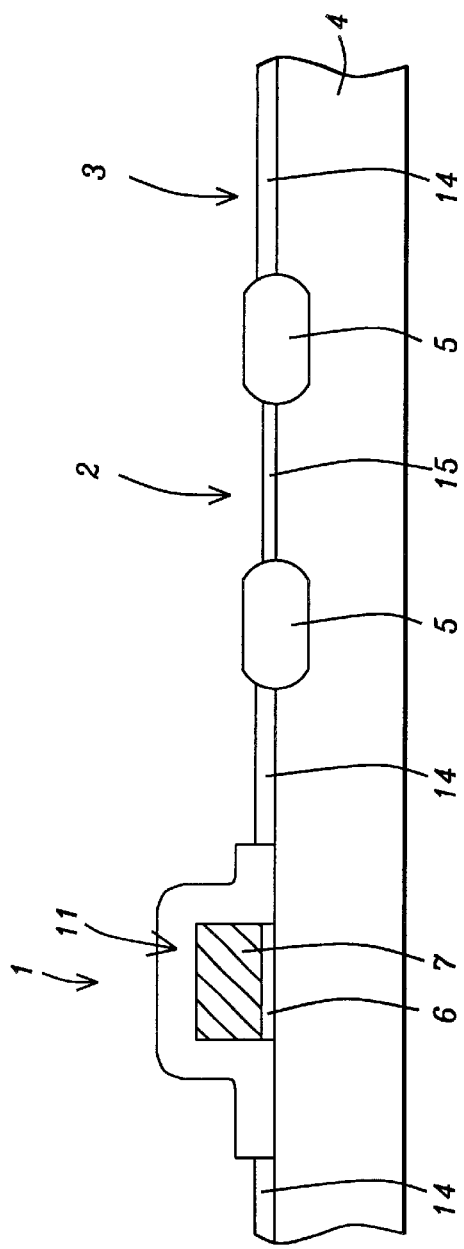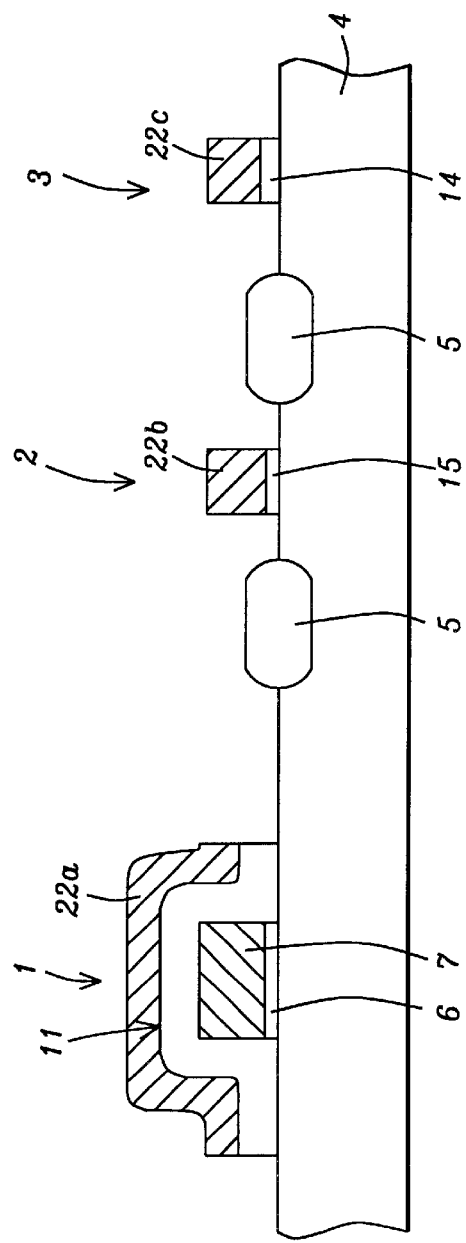

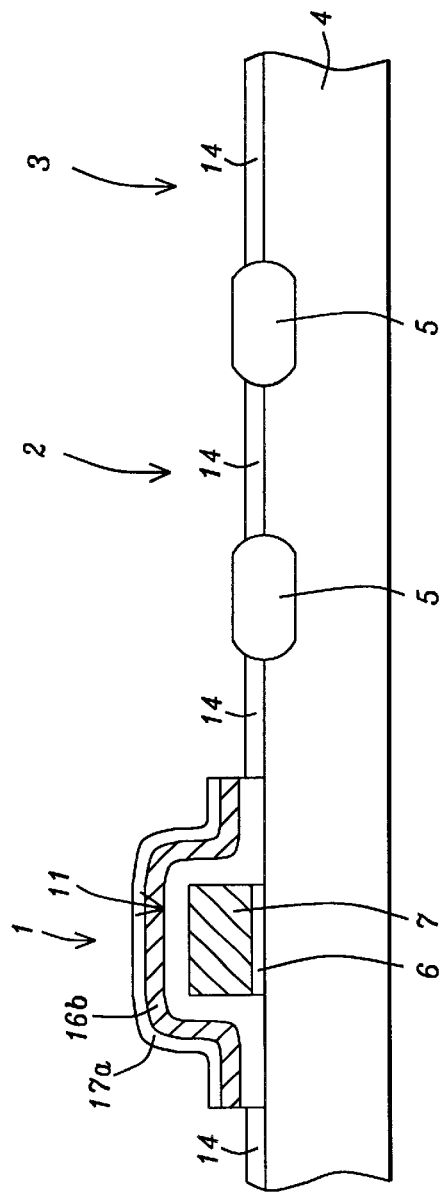
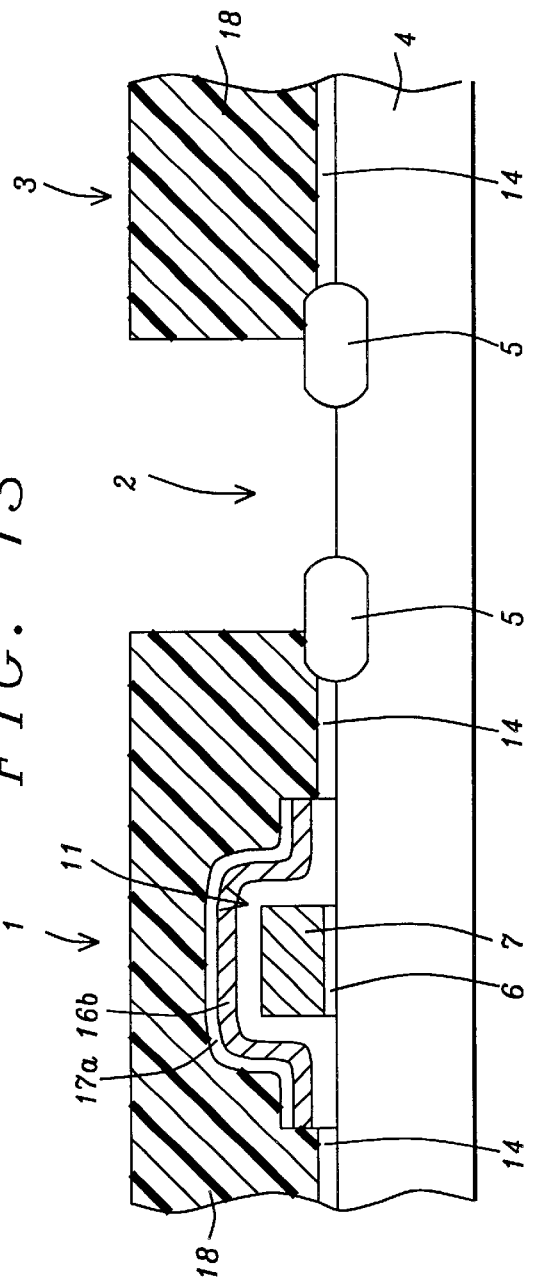

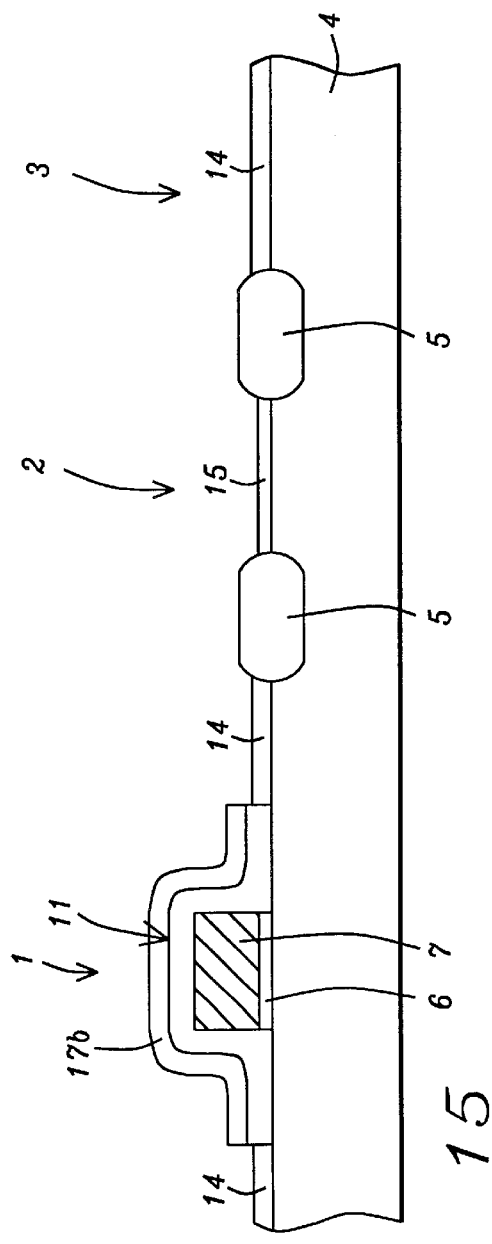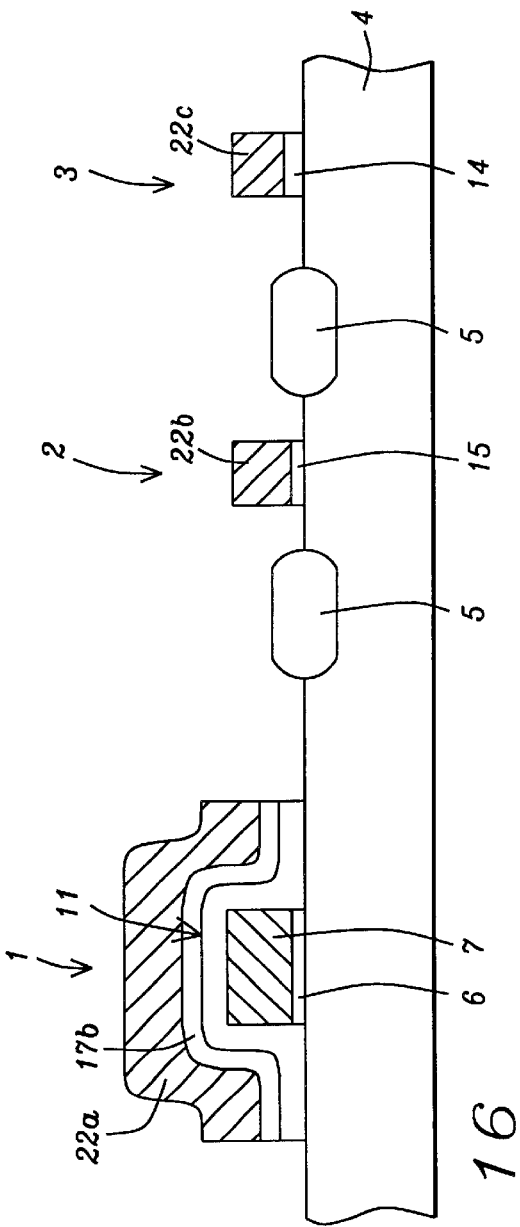

METHOD OF PRESERVING THE TOP OXIDE OF AN ONO DIELECTRIC LAYER VIA USE OF A CAPPING MATERIAL

BACKGROUND OF THE INVENTION (1) Field of the Invention

The present invention relates to methods used to fabricate semiconductor devices and more specifically to a method used to protect a dielectric layer, used for a non-volatile memory, (particularly in EEPROM) application, during fabrication of peripheral embedded memory devices.

(2) Description of Prior Art

Non-volatile memory applications are being fabricated featuring an oxidized nitride on silicon oxide (ONO), dielectric layer formed on an underlying floating gate structure. The data retention characteristics of the non-volatile memory device is partially influenced by integrity of top portion of the ONO dielectric layer, the thin top oxide component obtained via the oxidation of a top portion of a silicon nitride layer. The thin oxide component controls the barrier height between the nitride component of the ONO dielectric and an overlying control gate structure, minimizing the charge loss from the underlying floating gate. However when peripheral high and low voltage devices are integrated with the non-volatile memory device, the critical top oxide component of the ONO dielectric layer can be exposed to processing sequences which can result in unwanted removal of portions of the top oxide layer, resulting in data retention degradation.

This invention will describe process sequences featuring materials which allow capping and protection of the top oxide component of the ONO dielectric layer to be achieved, therefore avoiding oxide loss during specific processes used in the integration of peripheral memory devices with the non-volatile memory device. In addition the thickness of the top oxide can be increased, as depicted in a second iteration of this invention. Prior art such as Lai et al in U.S. Pat. No. 6,448,126, as well as Camerlenghi in U.S. Pat. No. 6,420,223, describe methods of protecting ONO layers during some subsequent processing sequences. However these prior art do not describe the novel process sequence offered in the present invention wherein disposable capping materials are employed to protect the thin top oxide component of an ONO dielectric layer present on the non-volatile device, during specific fabrication sequences used for embedded peripheral memory devices.

SUMMARY OF THE INVENTION

It is an object of this invention to integrate the fabrication of a non-volatile memory device with the fabrication of low voltage and high voltage complimentary metal oxide semiconductor (CMOS), devices.

It is another object of this invention to protect the dielectric layer located on the floating gate structure of the non-volatile memory device during hydrofluoric acid type procedures used with the fabrication sequence for the low and high voltage CMOS devices.

It is still another object of this invention to employ a disposable silicon nitride layer, or a disposable polysilicon layer, on the floating gate structure to protect the dielectric layer on the floating gate structure so that hydrofluoric acid type cleaning procedures can be used with the fabrication of the low and high CMOS devices, resulting in better gate oxide integrity (GOI).

In accordance with the present invention a method of integrating the fabrication of a non-volatile memory device with the fabrication of low voltage and high voltage complimentary metal oxide semiconductor (CMOS), devices, featuring the use of a capping layer used to protect the dielectric layer located on the floating gate structure of the non-volatile memory device, during hydrofluoric acid type procedures, either dilute hydrofluoric (DHF), or buffered hydrofluoric (BHF), performed during the fabrication sequence of the low and high voltage CMOS devices, is described. A first iteration of this invention entails the formation of the floating gate structure of the non-volatile device in a first region of a semiconductor substrate, followed by formation of an overlying oxidized silicon nitride on silicon oxide (ONO), dielectric layer. After deposition of a silicon nitride capping layer definition of the silicon nitride layer and of the ONO dielectric layer is only on the floating gate structure in the first region of the semiconductor substrate. After a hydrofluoric acid type pre-clean procedure a first gate insulator layer is thermally grown on exposed semiconductor portions in second and third regions, followed by removal of the first gate insulator layer from the second region of semiconductor substrate. The silicon nitride cap layer is then disposed, removed by dipping into phosphoric acid ($H_3PO_4$). After removal of the capping silicon nitride layer, located overlying the ONO dielectric layer located on the floating gate structure, another clean procedure, without hydrofluoric acid, is performed followed by the growth of a second gate insulator layer on the exposed portions of the second region of semiconductor substrate, with the second gate insulator layer thinner than the first gate insulator layer. Completion of integrated fabrication procedure is accomplished via simultaneous formation of a polysilicon control gate structure on the ONO dielectric layer of the non-volatile memory device located in the first region of the semiconductor substrate, and of polysilicon gate structures in the second and third regions of the low and high voltage CMOS devices respectfully.

A second iteration of this invention features definition of a polysilicon capping layer on an underlying ONO dielectric layer, located on a floating gate structure of a non-volatile memory device in a first region of a semiconductor substrate. After a hydrofluoric acid type pre-clean procedure a first oxidation procedure is performed resulting in the formation of a first gate insulator layer on second and third regions of the semiconductor substrate, while partial oxidation of a top portion of the polysilicon capping layer occurs. After removal of the first gate insulator layer from the second region of the semiconductor substrate via a buffered hydrofluoric (BHF) acid type procedure, a second oxidation procedure is performed resulting in the formation of a second gate insulator layer in the second region of the semiconductor substrate, with the second gate insulator layer thinner than the first gate insulator layer, and with the second oxidation procedure resulting in total oxidation of the polysilicon capping layer located on the ONO dielectric layer. This results in self removal of the disposable polysilicon cap layer. Again completion of the integrated fabrication procedure is accomplished via simultaneous formation of a polysilicon control gate structure on the oxidized polysilicon capping layer, located overlying the ONO dielectric layer of the non-volatile memory device, and of polysilicon gate structures on the second and third regions of the low and high voltage CMOS devices respectfully.

BRIEF DESCRIPTION OF THE DRAWINGS

The object and other advantages of this invention are best described in the preferred embodiments with reference to the attached drawings that include:

FIGS. 1–10, which schematically, in cross-sectional style, illustrate a first iteration of this invention, wherein a silicon nitride capping layer is used to protect the dielectric layer of a non-volatile memory device during hydrofluoric acid type procedures performed during fabrication of embedded low and high voltage CMOS devices.

FIGS. 11–16, which schematically, in cross-sectional style, illustrate a second iteration of this invention, wherein a self removing polysilicon capping layer is used to protect the dielectric layer of a non-volatile memory device during hydrofluoric acid type procedures performed during fabrication of embedded low and high voltage CMOS devices.

DESCRIPTION OF THE PREFERRED EMBODIMENTS

Figure 1:
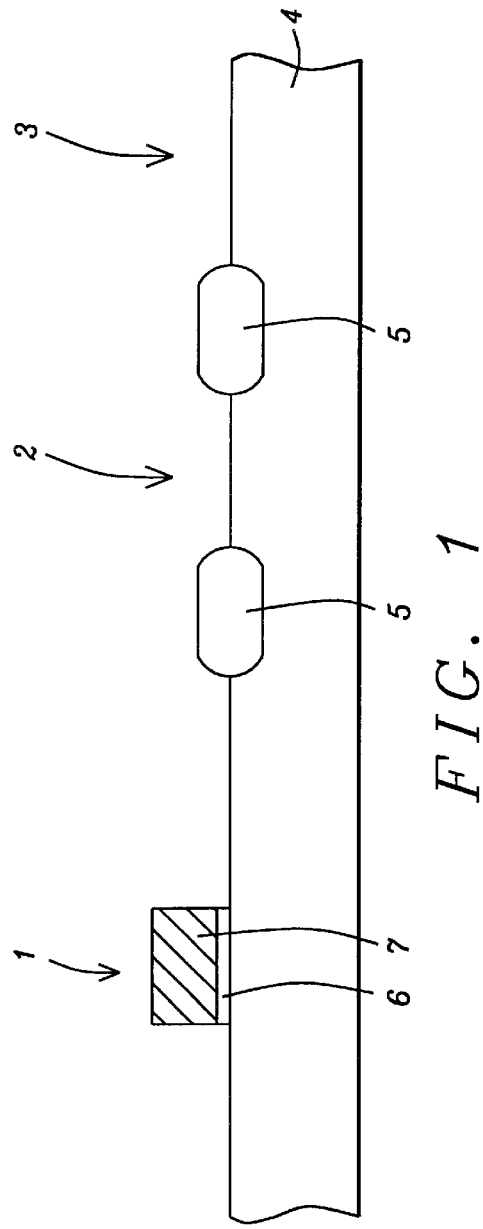

Methods of integrating the fabrication of a non-volatile memory device with the fabrication of embedded low voltage and high voltage complimentary metal oxide semiconductor (CMOS), devices, featuring the use of a capping layer used to protect the dielectric layer located on the floating gate structure of the non-volatile memory device during hydrofluoric acid type procedures, such as dilute hydrofluoric (DHF), performed during the fabrication sequence of the low and high voltage CMOS devices, will now be described in detail. Semiconductor substrate 4, comprised of single crystalline silicon and featuring a <100> crystallographic orientation, is used and schematically shown in FIG. 1. Region 1, of semiconductor substrate 4, will be used to accommodate a non-volatile memory device, while regions 2 and 3, will be used to accommodate a low voltage CMOS device as a high voltage CMOS device, respectfully. Isolation between devices is provided by regions 5, comprised of either thermally grown field oxide (FOX), regions, or insulator filled shallow trench isolation (STI), regions. Referring to FIG. 1, the floating gate structure 7, and an underlying, thin silicon dioxide layer 6, are formed in non-volatile memory region 1. Silicon dioxide layer 6, to be used as the tunnelling insulator layer of the non-volatile memory device is obtained at a thickness between about 75 to 95 Angstroms, via thermal oxidation procedures. A polysilicon layer is next deposited at a thickness between about 2000 to 4000 Angstroms via low pressure chemical vapor deposition (LPCVD), procedures. The polysilicon layer can be doped in situ during deposition via the addition of either arsine, phosphine, or diborane, to a silane or disilane ambient. If desired the polysilicon layer can be deposited intrinsically then doped via implantation of arsenic, phosphorous, or boron ions. A photoresist shape, not shown in the drawings, is used as an etch mask to allow polysilicon floating gate structure 7, to be defined on silicon dioxide layer 6, in region 1, via anisotropic reactive ion etching (RIE), procedures using $Cl_2$ or $SF_6$ as an etchant for polysilicon. Removal of the photoresist shape is accomplished via plasma oxygen ashing and wet clean procedures, with a buffered hydrofluoric acid component of the wet clean procedure removing the portions of silicon dioxide layer 6, not covered by floating gate structure 7. The result of these procedures is schematically shown in FIG. 1.

Figure 2:
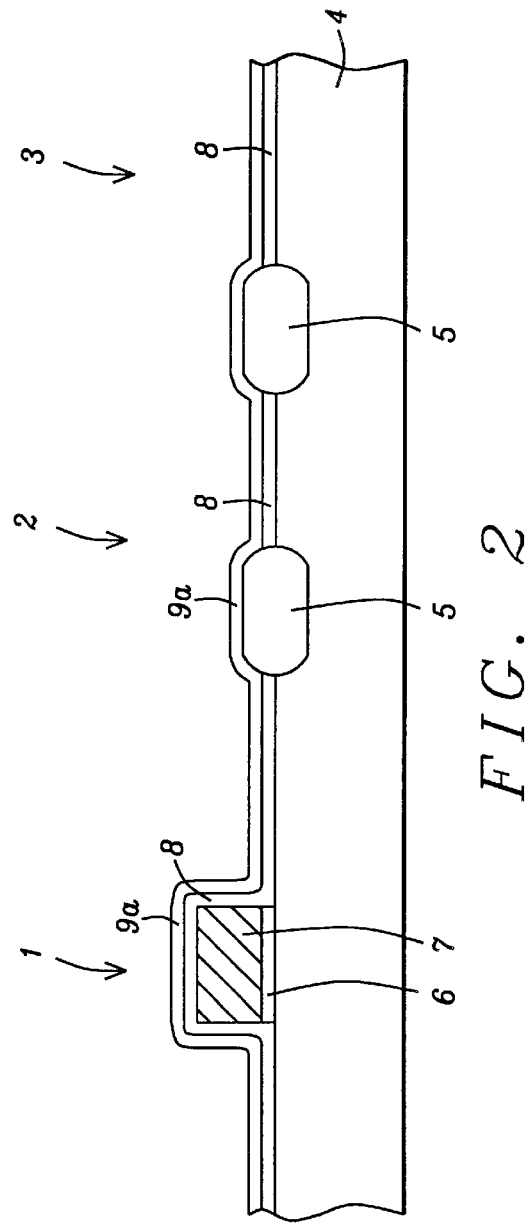
Figure 3:
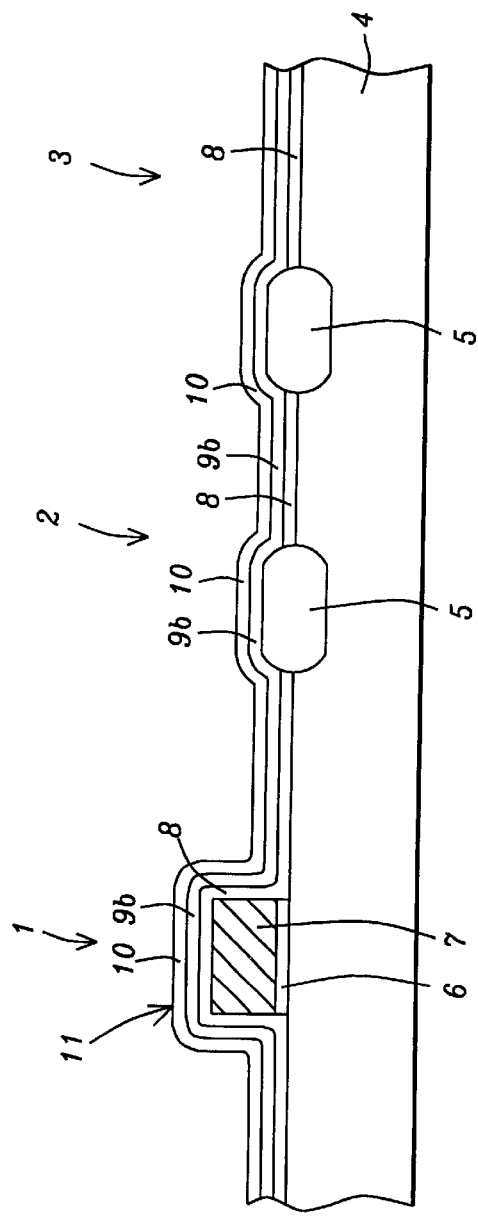

Formation of ONO layer 11, is next addressed and schematically shown using FIGS. 2–3. Silicon dioxide layer 8, is first obtained at a thickness between about 100 to 200, on floating gate structure 7, via thermal oxidation procedures. The portion of silicon dioxide layer 8, on the surfaces of floating gate structure 7, is obtained via thermal oxidation of polysilicon, while other portions of silicon dioxide layer 8, are obtained via thermal oxidation of semiconductor substrate 4. Silicon nitride layer 9a, shown schematically in FIG. 2, is next deposited via LPCVD procedures to a thickness between about 100 to 200 Angstroms. A thermal oxidation procedure is next performed at a temperature between about 900 to 1000° C., in an oxygen-steam or in an oxygen ambient, forming oxidized silicon nitride (ON), or silicon oxide layer 10, at a thickness between about 30 to 50 Angstroms, on the remaining bottom portion of silicon nitride, silicon nitride layer 9b, now at a reduced thickness between about 60 to 150 Angstroms. The result of the above procedures result in the formation of ONO, (oxidized silicon nitride on silicon oxide), layer 11, on floating gate structure 7, as well as on other surfaces of regions 1, 2, and 3. This is schematically shown in FIG. 3.

Figure 4:
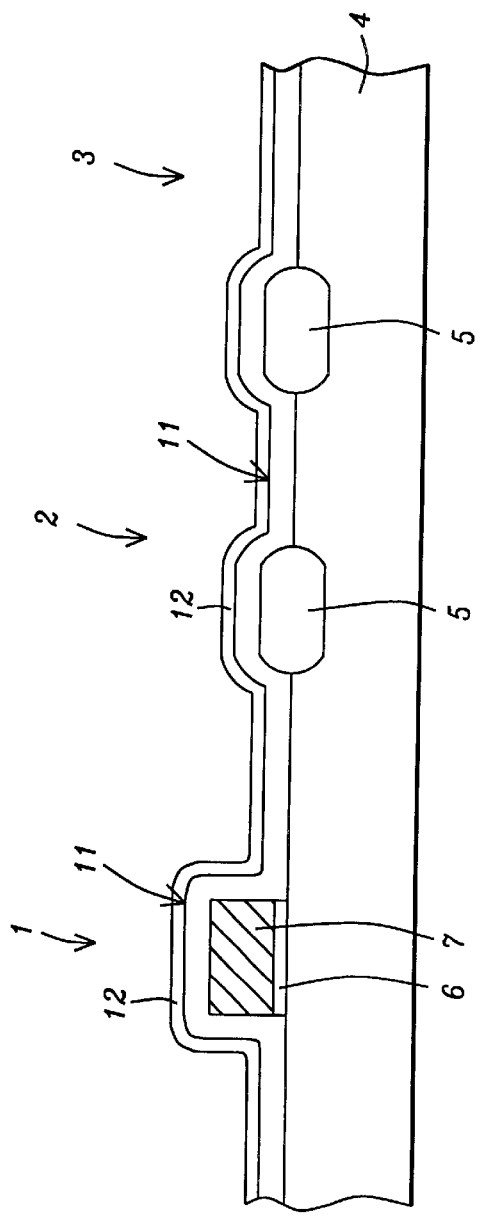
Figure 11:
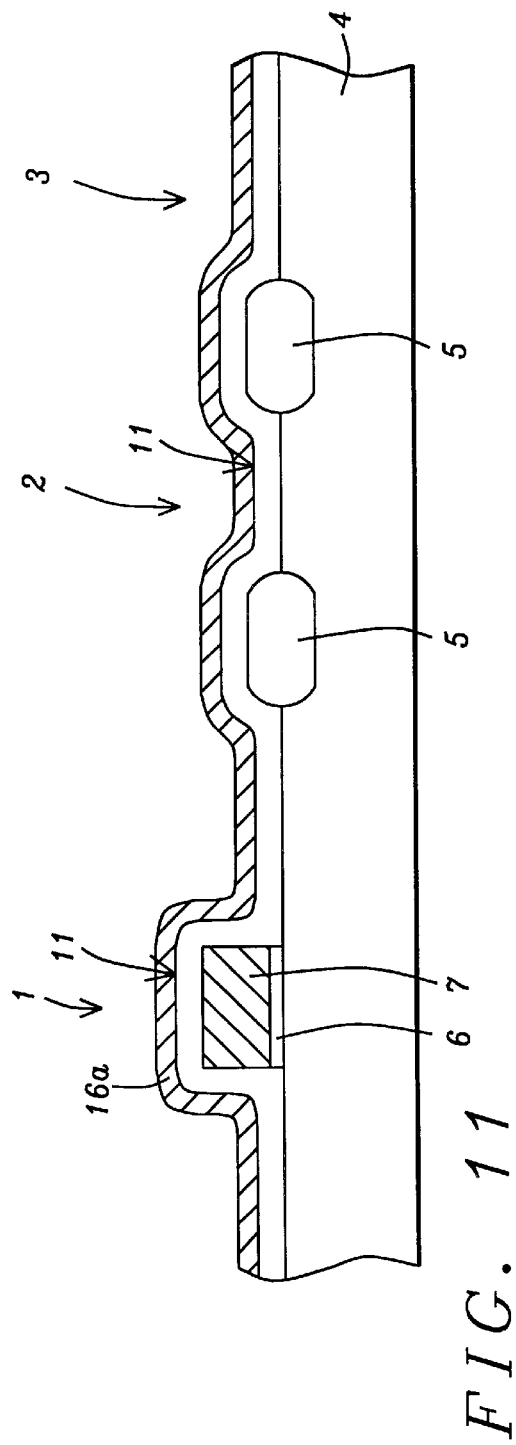

Silicon oxide layer 10, of ONO dielectric layer 11, is critical for the data retention requirement of a non-volatile memory device, and therefore the ability to maintain the thickness of silicon dioxide layer 10, during subsequent processing sequences used for fabrication of the low and high voltage CMOS devices, is paramount. If left exposed, or not protected during specific subsequent processing steps, unwanted thinning of silicon oxide layer 10, would occur, deleteriously influencing the reliability and yield of the non-volatile memory device. Therefore a first iteration of this invention will describe a process sequence in which a silicon nitride capping layer is used to protect ONO layer 11, during subsequent processing procedures. Silicon nitride capping layer 12, shown schematically in FIG. 4, is deposited at a thickness between about 100 to 200 Angstroms via LPCVD procedures. Photoresist shape 13, shown schematically in FIG. 5, is used as an etch mask to allow removal of exposed portions of silicon nitride capping layer 12, and of ONO layer 11. This is accomplished via anisotropic RIE procedures, using $CF_4$ or $Cl_2$ as an etchant for silicon nitride capping layer 12, and for silicon nitride layer 9b, while $CHF_3$ is used as an etchant for oxidized silicon nitride layer 10, and for silicon oxide layer 8. The result of this procedure results in ONO layer 11, overlaid by silicon nitride capped layer 12, on floating gate structure 7, in non-volatile memory region 1. This is schematically shown in FIG. 5. Removal of photoresist shape 13, is accomplished via plasma oxygen ashing procedures.

Preparation for growth of silicon dioxide layer 14, to be used a gate insulator layer for a high voltage CMOS device, initiates with a pre-clean procedure performed using an RCA clean with a final cycle using a dilute hydrofluoric (DHF), solution, employed to remove native oxide from the surface of semiconductor substrate 4, in regions 2 and 3. If left unremoved the native oxide would be incorporated into a subsequently grown silicon dioxide gate insulator, compromising the thickness and quality of the silicon dioxide gate insulator layer. The presence of silicon nitride capping layer 12, on ONO layer 11, protects the thin, oxidized silicon nitride component 10, during the DHF pre-clean procedure. After the DHF pre-clean procedure silicon dioxide layer 14, is thermally grown in an oxygen-steam ambient, to a thickness between about 150 to 250 Angstroms. Silicon dioxide layer 14, shown schematically in FIG. 6, will be used as the gate insulator layer for a high voltage CMOS device, to be formed in region 3, of semiconductor substrate 4.

Photoresist shape 20, is next formed and used as an mask to allow silicon dioxide layer 14, to be removed only from the surface of semiconductor substrate 4, in region 2, the region in which a low voltage CMOS device will be fabricated. Removal of this portion of silicon dioxide layer 14, is accomplished via wet etch procedures using a buffered hydrofluoric (BHF), solution as an etchant for silicon dioxide layer 14. This is schematically shown in FIG. 7. After removal of photoresist shape 20, via plasma oxygen ashing procedures, silicon nitride capping layer 12, is removed from the surface of ONO layer 11, via use of a hot phosphoric acid solution. This is schematically shown in FIG. 8. After a RCA clean procedure, with or without exposure to a final short DHF procedure, resulting in minimal thickness loss of oxidized silicon nitride layer 10, silicon dioxide gate insulator layer 15, is grown. Silicon dioxide layer 15, is thermally grown in an oxygen-steam ambient, at a thickness between about 50 to 80 Angstroms, on the surface of semiconductor substrate 4, in region 2. Silicon dioxide layer 15, shown schematically in FIG. 9, will be used as the gate insulator layer for a low voltage CMOS device. Any thickness loss of silicon dioxide layer 14, in region 3, occurring during the pre-clean procedure employed prior to growth of silicon dioxide layer 15, could be regrown during the thermal oxidation procedure used for attainment of silicon dioxide layer 15.

Completion of the non-volatile memory device in region 1, of the low voltage CMOS device in region 2, and of the high voltage CMOS device in region 3, is next addressed and schematically shown in FIG. 10. A polysilicon layer is deposited to a thickness between about 2000 to 4000 Angstroms, via LPCVD procedures, with the polysilicon layer again being doped either in situ during deposition, or via ion implantation procedures after an intrinsic deposition. A photoresist shape, not shown in the drawings, is used as an etch mask to allow an anisotropic RIE procedure to define polysilicon control gate structure 22a, on ONO layer 11, for the non-volatile memory device, in addition to simultaneous definition of polysilicon gate structure 22b, on silicon dioxide gate insulator layer 15, for the low voltage CMOS device, and of polysilicon gate structure 22c, on silicon dioxide gate insulator layer 14, for the high voltage CMOS device. The anisotropic RIE procedure is performed using $Cl_2$ or $SF_6$ as a selective etchant for polysilicon. Removal of the photoresist shape used to define the polysilicon gate structures is accomplished via plasma oxygen ashing procedures. The formation of other elements of these devices, such as insulator spacers on the sides of the polysilicon gate structures, as well as source/drain regions in areas of semiconductor substrate 4, not covered by the gate structures, will not be described.

Figure 12:
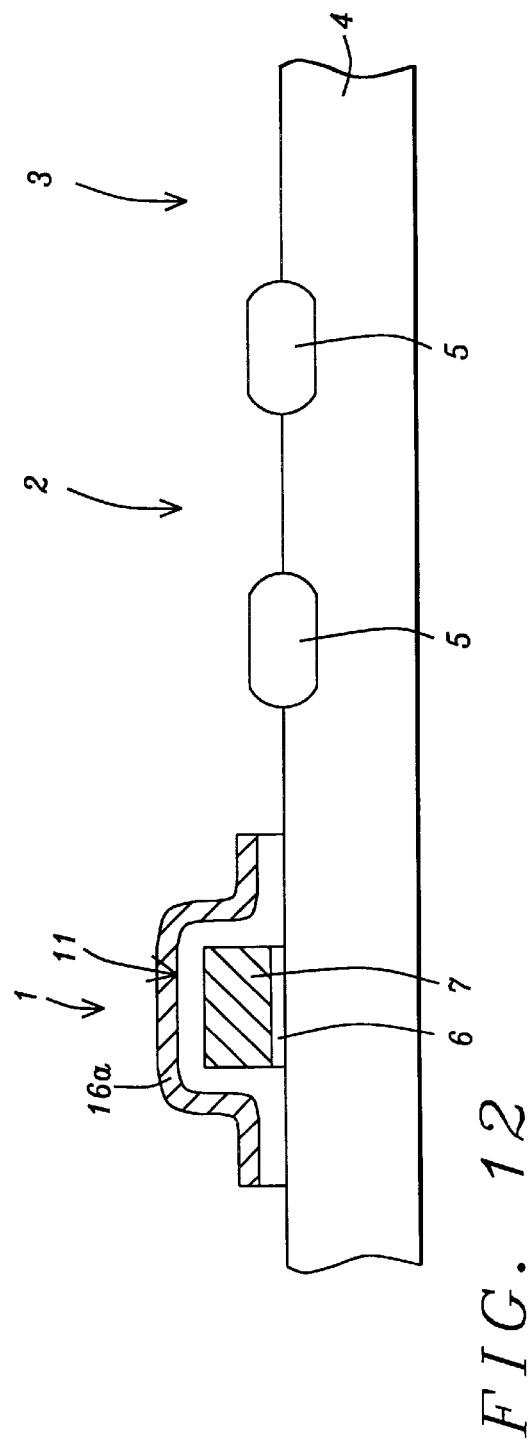

A second iteration of this invention, described using FIGS. 11–16, features the use of a polysilicon capping layer for protection of the oxidized silicon nitride component of an ONO layer during subsequent hydrofluoric acid procedures. After formation of ONO layer 11, on floating gate structure 7, in non-volatile memory region 1, as well as on all areas of regions 2 and 3, used for the low and high CMOS devices, polysilicon layer 16a, is deposited via LPCVD procedures to a thickness between about 100 to 300 Angstroms. Polysilicon layer 16a, shown schematically in FIG. 11, to be used as a capping layer for ONO layer 11, is deposited intrinsically. A photoresist shape, not shown in the drawings, is used as an etch mask, allowing an anisotropic RIE procedure to define a polysilicon capped ONO layer on the floating gate structure in non-volatile memory region 1. The anisotropic RIE procedure used to remove the portions of polysilicon layer 16a, and the portions of ONO layer 11, not covered by the photoresist shape in regions 2 and 3, is performed using $Cl_2$ as an etchant for polysilicon layer 16a, $Cl_2$ or $CF_4$ as an etchant for the unoxidized portion of silicon nitride in the ONO layer, and $CHF_3$ as an etchant for the silicon oxide component and for the oxidized portion of the silicon nitride of the same ONO layer. The photoresist shape used for definition of the polysilicon capping layer and for the ONO layer is removed via plasma oxygen ashing procedures. The result of these procedures is schematically shown in FIG. 12.

Preparation for the growth of silicon dioxide layer 14, to be used a gate insulator layer for a high voltage CMOS device, again as was the case in the first iteration of this invention initiates with a pre-clean procedure performed using a RCA clean procedure with exposure to a final dilute hydrofluoric (DHF), solution, employed to remove native oxide from the surface of semiconductor substrate 4, in regions 2 and 3. If left unremoved the native oxide would be incorporated into a subsequently grown silicon dioxide gate insulator, compromising the thickness and quality of the silicon dioxide gate insulator layer. The presence of polysilicon capping 16a, on ONO layer 11, protects the thin, oxidized silicon nitride component 10, during the DHF pre-clean procedure. After the DHF pre-clean procedure silicon dioxide layer 14, is thermally grown in an oxygen-steam ambient, to a thickness between about 150 to 250 Angstroms. Silicon dioxide layer 14, shown schematically in FIG. 13, will be used as the gate insulator layer for a high voltage CMOS device, to be formed in region 3, of semiconductor substrate 4. Exposure of polysilicon capping layer 16a, to the thermal oxidation procedure used to grow silicon dioxide layer 14, also results in oxidation of a top portion of the polysilicon capping layer. Silicon oxide layer 17a, at a thickness between about 100 to 200 Angstroms is now located overlying a thinned polysilicon capping layer 16b, now at a thickness between about 50 to 100 Angstroms. This is schematically shown in FIG. 13.

Photoresist shape 18, is next formed and used as an mask to allow silicon dioxide layer 14, to be completely removed from the surface of semiconductor substrate 4, in region 2, the region in which a low voltage CMOS device will be fabricated. Removal of this portion of silicon dioxide layer 14, is accomplished via wet etch procedures using either a BHF, solution as an etchant for silicon dioxide layer 14. If desired photoresist shape 18, can also cover non-volatile memory region 1, during the DHF or BHF procedure. This is schematically shown in FIG. 14. However if left uncovered silicon oxide layer 17a, would be removed but thinned polysilicon capping layer 16b, would still be present to protect the oxidized silicon nitride component of the ONO layer from the etch step.

After removal of photoresist shape 18, via plasma oxygen ashing procedures an RCA clean procedure with exposure to a final DHF preclean cycle can be employed to prepare the semiconductor surface in region 2, for growth of silicon dioxide layer 15. The DHF procedure results in either partial or total removal of silicon oxide layer 17a, the layer overlying thinned polysilicon capping layer 16b. Silicon dioxide layer 15, is then thermally grown in an oxygen-steam ambient, to a thickness between about 50 to 80 Angstroms, on the surface of semiconductor substrate 4, in region 2. Silicon dioxide layer 15, shown schematically in FIG. 15, will be used as the gate insulator layer for a low voltage memory device. The above oxidation procedure should result in complete oxidation of the thinned polysilicon capping layer, resulting in a silicon oxide layer 17b, shown schematically in FIG. 15, now at a thickness between about 50 to 100 Angstroms, overlying ONO layer 11. This additional oxide adds on to the top oxide of the ONO layer and thus helps to improve the data retention (otherwise not possible as oxidation of nitride can only produce very thin top oxide (about 50 Angstroms).

Completion of the non-volatile memory device in region 1, of the low voltage CMOS device in region 2, and of the high voltage CMOS device in region 3, is accomplished using identical processing sequences used in the first iteration of this invention. A polysilicon layer is deposited to a thickness between about 2000 to 4000 Angstroms, via LPCVD procedures, with the polysilicon layer being doped either in situ during deposition, or via ion implantation procedures after an intrinsic deposition. A photoresist shape, not shown in the drawings, is used as an etch mask to allow an anisotropic RIE procedure to define polysilicon control gate structure 22a, on ONO layer 11, (overlaid with thicker silicon oxide layer 17b), for the non-volatile memory device, in addition to simultaneously defining polysilicon gate structure 22b, on silicon dioxide gate insulator layer 15, for the low voltage CMOS device, and polysilicon gate structure 22c, on silicon dioxide gate insulator layer 14, for the high voltage CMOS device. The anisotropic RIE procedure is performed using $CHF_4$ as an etchant for silicon oxide layer 17b, $Cl_2$ or $SF_6$ as a selective etchant for polysilicon. Removal of the photoresist shape used to define the polysilicon gate structures is accomplished via plasma oxygen ashing procedures. The formation of other elements of these devices, such as insulator spacers on the sides of the polysilicon gate structures, as well as source/drain regions in areas of semiconductor substrate 4, not covered by the gate structures, will not be described.

While this invention has been particularly shown and described with reference to the preferred embodiments thereof, it will be understood by those skilled in the art that various changes in form and details may be made without departing from the spirit and scope of this invention.

What is claimed is:

1. A method of forming semiconductor devices on a semiconductor substrate, comprising the steps of:
    providing a first gate insulator layer in a first region of said semiconductor substrate, with a first conductive gate structure located on said first gate insulator layer;
    forming a dielectric layer on said first conductive gate structure;
    forming a capping layer on said dielectric layer;
    performing a first pre-clean treatment on a second region, and on a third region of said semiconductor substrate;
    forming a second gate insulator layer on said semiconductor substrate in said second, region and in said third region of said semiconductor substrate;
    removing said second gate insulator layer from said second region of said semiconductor substrate;
    removing said capping layer;
    performing a second pre-clean treatment to a second region of said semiconductor substrate;
    forming a third gate insulator layer on said second region of said semiconductor substrate; and
    forming a second conductive gate structure on said dielectric layer, a third conductive gate structure on said second gate insulator layer, and a fourth conductive gate structure on said third gate insulator layer.

2. The method of claim 1, wherein said dielectric layer is an oxidized silicon nitride on silicon oxide (ONO), layer.

3. The method of claim 1, wherein the thickness of an oxidized silicon nitride component of said dielectric layer is between about 30 to 50 Angstroms.

4. The method of claim 1, wherein said capping layer is a silicon nitride layer at a thickness between about 100 to 200 Angstroms.

5. The method of claim 1, wherein said first pre-clean procedure is performed using an RCA clean procedure with a final exposure to a dilute hydrofluoric (DHF), solution.

6. The method of claim 1, wherein said second gate insulator layer is a silicon dioxide layer obtained via thermal oxidation procedures at a thickness between about 150 to 250 Angstroms.

7. The method of claim 1, wherein said second gate insulator is removed from said second region of said semiconductor substrate via use of either a buffered hydrofluoric acid solution.

8. The method of claim 1, wherein said capping layer is removed using a hot phosphoric acid solution.

9. The method of claim 1, wherein said second pre-clean procedure is performed using an RCA clean, with or without dilute hydrofluoric acid.

10. The method of claim 1, wherein said third gate insulator layer is a silicon dioxide layer, obtained via thermal oxidation procedures at a thickness between about 50 to 80 Angstroms.

11. A method of protecting an oxidized silicon nitride on silicon oxide (ONO), layer of a first semiconductor device, during fabrication of additional semiconductor devices, comprising the steps of:
    forming a first gate insulator layer in a first region of said semiconductor substrate, to be used for said first semiconductor device,
    forming a floating gate structure on said first gate insulator layer;
    forming said ONO layer overlaid with a silicon nitride capping layer, on said floating gate structure;
    performing a first pre-clean treatment on a second region, and on a third region of said semiconductor substrate;
    forming a second gate insulator layer on said semiconductor substrate in said second, region and in said third region of said semiconductor substrate;
    removing said second gate insulator layer from said second region of said semiconductor substrate;
    removing said silicon nitride capping layer;
    performing a second pre-clean treatment to a second region of said semiconductor substrate;
    forming a third gate insulator layer on said second region of said semiconductor substrate; and
    forming a control gate structure on said dielectric layer for said first semiconductor device, forming a first conductive gate structure on said second gate insulator layer for a second semiconductor device, and a forming a second conductive gate structure on said third gate insulator layer for a third semiconductor device.

12. The method of claim 11, wherein said first gate insulator layer is a tunnelling layer, comprised of silicon dioxide, at a thickness between about 75 to 95 Angstroms.

13. The method of claim 11, wherein said floating gate structure is a polysilicon gate structure, at a thickness between about 2000 to 4000 Angstroms.

14. The method of claim 11, wherein the thickness of the top component of said ONO layer, an oxidized silicon nitride component, is between about 30 to 50 Angstroms.

15. The method of claim 11, wherein the thickness of said silicon nitride capping layer is between about 100 to 200 Angstroms.

16. The method of claim 11, wherein said first pre-clean procedure is performed using an RCA clean with dilute hydrofluoric (DHF).

17. The method of claim 11, wherein said second gate insulator layer is a silicon dioxide layer obtained via thermal oxidation procedures to a thickness between about 150 to 250 Angstroms.

18. The method of claim 11, wherein said second gate insulator is removed from said second region of said semiconductor substrate via use of either a DHF or a buffered hydrofluoric acid solution.

19. The method of claim 11, wherein said silicon nitride capping layer is removed using a hot phosphoric acid solution.

20. The method of claim 11, wherein said second pre-clean procedure is performed without using a DHF solution, with or without DHF.

21. The method of claim 11, wherein said third gate insulator layer is a silicon dioxide layer obtained via thermal oxidation procedures at a thickness between about 50 to 80 Angstroms.

22. The method of claim 11, wherein said control gate structure, said first conductive gate structure, and said second conductive gate structure, are comprised of polysilicon and formed simultaneously.

23. A method of protecting an oxidized silicon nitride on silicon oxide (ONO), layer for a first semiconductor device, during fabrication of additional semiconductor devices, comprising the steps of:

forming a first gate insulator layer in a first region of said semiconductor substrate, wherein said first region to be used to accommodate said first semiconductor device;

forming a floating gate structure on said first gate insulator layer;

forming said ONO layer overlaid with a polysilicon capping layer, on said floating gate structure;

performing a first pre-clean treatment on a second region, and on a third region of said semiconductor substrate;

forming a second gate insulator layer on said semiconductor substrate in said second, region and in said third region of said semiconductor substrate, and forming a first silicon oxide layer on a top portion of said polysilicon capping layer;

removing said second gate insulator layer from said second region of said semiconductor substrate;

performing a second pre-clean treatment to a second region of said semiconductor substrate, removing said first silicon oxide layer from said polysilicon capping layer;

forming a third gate insulator layer on said second region of said semiconductor substrate, and forming a second silicon oxide layer on said ONO layer via complete oxidation of said polysilicon capping layer; and forming a control gate structure on said second silicon oxide layer overlying said ONO layer, for said first semiconductor device, forming a first conductive gate structure on said second gate insulator layer for a second semiconductor device, and forming a second conductive gate structure on said third gate insulator layer for a third semiconductor device.

24. The method of claim 23, wherein the thickness of the top component of said ONO layer, an oxidized silicon nitride component, is between about 30 to 50 Angstroms.

25. The method of claim 23, wherein the thickness of said polysilicon capping layer is between about 100 to 300 Angstroms.

26. The method of claim 23, wherein said first pre-clean procedure is performed using an RCA clean procedure with a final exposure to a dilute hydrofluoric (DHF), solution.

27. The method of claim 23, wherein said second gate insulator layer is a silicon dioxide layer obtained via thermal oxidation procedures at a thickness between about 150 to 250 Angstroms.

28. The method of claim 23, wherein said second gate insulator is removed from said second region of said semiconductor substrate using a buffered hydrofluoric acid solution.

29. The method of claim 23, wherein said second pre-clean procedure is performed using an RCA clean procedure with a final exposure to a DHF solution.

30. The method of claim 23, wherein said third gate insulator layer is a silicon dioxide layer obtained via thermal oxidation procedures at a thickness between about 50 to 80 Angstroms, also resulting in total oxidation of the polysilicon capping layer.

31. The method of claim 23, wherein the thickness of said second silicon oxide layer, obtained via oxidation of the polysilicon capping layer located on said ONO layer, which in turn is located on said floating gate structure, is between about 100 to 120 Angstroms, which is much thicker than the 30 to 50 Angstroms that would be achieved without a polysilicon capping layer.

* * * * *